United States Patent [19]
Kusama

[11] Patent Number: 5,625,205
[45] Date of Patent: Apr. 29, 1997

[54] BIPOLAR TRANSISTOR CIRCUIT

[75] Inventor: Noboru Kusama, Tokyo, Japan

[73] Assignee: NEC Corporation, Tokyo, Japan

[21] Appl. No.: 710,973

[22] Filed: Sep. 24, 1996

Related U.S. Application Data

[63] Continuation of Ser. No. 252,921, Jun. 2, 1994, abandoned.

[30] Foreign Application Priority Data

| Jun. 2, 1993 | [JP] | Japan | 5-156299 |
| Jun. 2, 1993 | [JP] | Japan | 5-156300 |
| Jun. 2, 1993 | [JP] | Japan | 5-156301 |

[51] Int. Cl.$^6$ ............ H01L 31/0328; H01L 31/0336; H01L 31/072; H01L 31/109
[52] U.S. Cl. .......... 257/197; 257/200; 257/586; 330/285; 330/300
[58] Field of Search .................. 257/197, 200, 257/586; 330/285, 300

[56] References Cited

U.S. PATENT DOCUMENTS

| 4,807,008 | 2/1989 | Chang et al. | 257/197 |
| 4,847,568 | 7/1989 | Nazoa-Ruiz | 330/277 |
| 5,010,382 | 4/1991 | Katoh | 257/197 |
| 5,073,812 | 12/1991 | Shimura . | |
| 5,212,103 | 5/1993 | Shimura . | |
| 5,336,909 | 8/1994 | Katoh et al. | 257/198 |
| 5,347,229 | 9/1994 | Suckling et al. | 330/251 |
| 5,406,224 | 4/1995 | Mikami et al. | 330/277 |
| 5,406,227 | 4/1995 | Williams | 330/306 |
| 5,410,158 | 4/1995 | Kane et al. | 257/10 |
| 5,420,589 | 5/1995 | Wells et al. | 342/22 |

FOREIGN PATENT DOCUMENTS

| 0359508 | 3/1990 | European Pat. Off. | 257/197 |
| 55-103777 | 8/1980 | Japan | 257/197 |
| 62-39063 | 2/1987 | Japan | 257/197 |
| 62-141772 | 6/1987 | Japan . | |
| 62-141771 | 6/1987 | Japan . | |
| 62-141770 | 6/1987 | Japan . | |
| 4-99382 | 3/1992 | Japan | 257/197 |

OTHER PUBLICATIONS

Sedra et al, "Microelectronic Circuits", p. 367, 1982.
Kroemer, Herbert "Heterostructure Bipolar Transistors and Integrated Circuits" *Proceedings of the IEEE*, vol. 70, No. 1, Jan. 1982 pp. 13–24.
S.M. Sze and G. Gibbons, "Avalanche Breakdown Voltages of Abrupt and Linearly Graded P-n Junctions in Ge, Si, GiAs, and GaP" *Applied Physics Letters*, Mar. 1, 1966, pp. 111–113.
B.A. McDonald, "Avalanche Degradation of $H_{fe}$" *Transactions in Electron Devices*, vol. ED. 17, No. 10, Oct. 1970, pp. 871–877.
C.D. Motchenbacher "Protect Your Transistors Against Turn-On or Testing Transient Damage" *Electronics*, Dec. 6, 1971, pp. 92–94.
Allen F. Podell and William W. Nelson, "High Volume, Low Cost, MMIC Receiver Front End" *IEEE*, 1986 pp. 57–59.

*Primary Examiner*—Ngân V. Ngô

[57] ABSTRACT

In an NPN type bipolar transistor, by employing AlGaAs or InGaAs having greater band gap than silicon, for an emitter and a base, doping amount of the emitter can be made smaller than that of the base to permit improvement of reverse withstanding voltage between the base and the emitter. Therefore, B class or C class bias can be used in a microwave band to improve efficiency.

1 Claim, 2 Drawing Sheets

BIPOLAR TRANSISTOR CIRCUIT

This is a continuation of application Ser. No. 08/252,921, filed Jun. 2, 1994 now abandoned.

BACKGROUND OF THE INVENTION

The present invention relates to a bipolar transistor circuit. More particularly, the invention relates to a bipolar transistor amplifier circuit of high efficiency and high output, suitable for use in a microwave band.

In the conventional microwave high output amplifier circuit, NPN type bipolar transistor has been typically employed as an amplifying oscillation element. Such NPN type bipolar transistor is formed primarily of silicon (Si) as a primary composition. The P type base region is situated in highly doped condition in order to lower a base resistance, and the emitter is in highly doped condition.

In such bipolar transistor, the base is inherently selected to be in the lower doped condition than the emitter to result in low reverse withstanding voltage between the base and the emitter in the order of 3 volts. Namely, the doping amount at the base is required to be lower than that of the emitter to certainly provide sufficient hfe. Therefore, upon application of reverse voltage, the transition region of P-N junction is spread toward the base side so that the reverse withstanding voltage becomes inversely proportional to the doped amount at the base side.

The relationship between unbalance brake voltage and doped amount in the P-N junction has been reported in APPLIED PHYSICS LETTERS, 1966, Vol. 8, No. 5, Page 111 (S. M. Sze and G. Gibbons) and that the reverse withstanding voltage is lowered in a certain extent either in Si or GaAs.

On the other hand, in order to enhance performance of a microwave transistor, it is required to lower the base resistance. Therefore, it becomes necessary to select the doping amount at the base greater. As a result, the reverse withstanding voltage between the emitter and the base of the microwave bipolar transistor can taken only low value.

When an operation point of the transistor is selected at a deeper point, such as that of B-class bias and so forth in order to achieve high output and high efficiency with such microwave transistor similar to an amplifier circuit widely used in a low frequency band, an input signal of the microwave is applied between the base and the emitter in superimposition to a bias voltage to exceed the reverse withstanding voltage between the base and emitter by a partial microwave waveform.

When a current is flown in a reverse direction between the base and emitter of the bipolar transistor even for a substantially short period, hfe of the transistor may be degraded. This has been reported in IEEE, 1970, Vol. ED-17, No. 10, Page 871 (B. A. Mcdonald).

In order to avoid reverse current between the base and the emitter to be a cause of degradation of hfe, it may be a solution for connecting a P-N junction diode in reverse connection, between the base and the emitter, for example. This method has been reported in Electronics Magazine, December, 1971, Page 92.

In this method, the capacity of the base and emitter of the bipolar transistor becomes a sum of the own capacity of the transistor and the capacity of the diode to significantly degrade high frequency characteristics. Therefore, it is not applicable for the circuit handling the signal of the microwave.

Therefore, in the microwave band, it is typical that the transistor is used in single or the transistors are used in a simple parallel connection. In case of a common-emitter type circuit, the transistors are frequently used with A-class bias. Therefore, it is inevitable to lower the efficiency.

In the case where the B-class bias is forcedly used, the common-base connection is employed to lower impedance at the input side and thus to make the voltage lower even when the input signal is in reverse phase. This holds disadvantage in that a gain at one stage of amplifier is low.

It should be noted that an example of a manner of connection, in which P-N junction diode being reverse connection is connected in parallel between the base and emitter in the microwave band oscillator circuit, has been disclosed in Japanese Unexamined Patent Publication No. 59-27485. However, even in this case, the microwave signal is not supplied to the added diode per se. Instead, the diode is inserted in the bias circuit so as to restrict deepening of the bias point according to growth of the oscillation. Thus, in the disclosed art, attention has been paid so as not to degrade the high frequency characteristics.

However, in this method, the bias point is fixed to make it not applicable for the microwave amplifier circuit, in which is required to restrict the peak of the microwave signal. Accordingly, in the conventional microwave amplifier circuits including a push-pull type the bias point is selected at shallower points so that a sum of the bias voltage and the peak voltage of the microwave signal will not exceed the reverse withstanding voltage between the base and the emitter.

In this case, a large current flows through the transistor even when the microwave signal is not present to subject lowering of efficiency and restriction of output. On the other hand, when the bias voltage is forcedly deepen, the diode is added in parallel but in the reverse direction between the base and emitter. This results in a problem of degradation of high frequency characteristics.

In view of the problems as set forth above, the push-pull circuit is rarely employed in the microwave band. However, for example, in IEEE, Microwave and Millimeter Wave Monolithic IC Symposium, held 1986, an example of the push-pull type oscillator and so forth has been discussed in a literature issued by Allen F. Podell and William. W., Nelson, "High Volume, Low Cost, MMIC Receiver Front End".

Furthermore, in the reason set forth above, it is rare to employ the bipolar transistor in a frequency multiplier circuit of the microwave. Typically, a frequency multiplier circuit employing a varacter diode is used. Such frequency multiplier circuit employing the varacter diode is quite difficult to adjust and has quite large multiplying loss.

Therefore, in order to realize the microwave frequency multiplier circuit employing the bipolar transistor, it becomes necessary to reduce the impedance at the input side by employing the common-base connection so that the input voltage can be suppressed to be lower voltage even in the case where the input signal is in reverse phase. However, this hold disadvantage in low gain of the multiplier circuit.

SUMMARY OF THE INVENTION

Therefore, it is an object of the present invention to provide a microwave band amplifier circuit having high efficiency and high output.

Another object of the present invention is to provide a microwave band push-pull circuit having high efficiency and high output.

A further object of the invention is to provide a microwave band frequency multiplier circuit having high efficiency and high gain.

According to one aspect of the invention, a transistor circuit comprising:

a NPN-type hereto-junction bipolar transistor used as an active element for amplification and employing AlGaAs for an emitter and a base; and bias means for providing 0 or negative bias voltage between the base and the emitter of said bipolar transistor.

According to another aspect of the invention, a transistor circuit comprising:

first and second bipolar transistors respectively employing AlGaAs for emitter and bases;

driving means for driving said first and second bipolar transistors in push-pull manner; and bias means for providing 0 bias for base and emitter of said first and second bipolar transistors.

According to a further aspect of the invention, a transistor circuit comprising:

a NPN-type hetero-junction bipolar transistor used as an active element for amplification and employing InGaAs for an emitter and a base; and bias means for providing 0 or negative bias voltage between the base and the emitter of the bipolar transistor.

BRIEF DESCRIPTION OF THE DRAWING

The present invention will be understood more fully from the detailed description given herebelow and from the accompanying drawings of the preferred embodiment of the present invention, which, however, should not be taken to be limitative to the present invention, but are for explanation and understanding only.

In the drawings.

DESCRIPTION OF THE PREFERRED EMBODIMENT

The present invention will be discussed in terms of the preferred embodiments with reference to the drawings.

Figure 1:
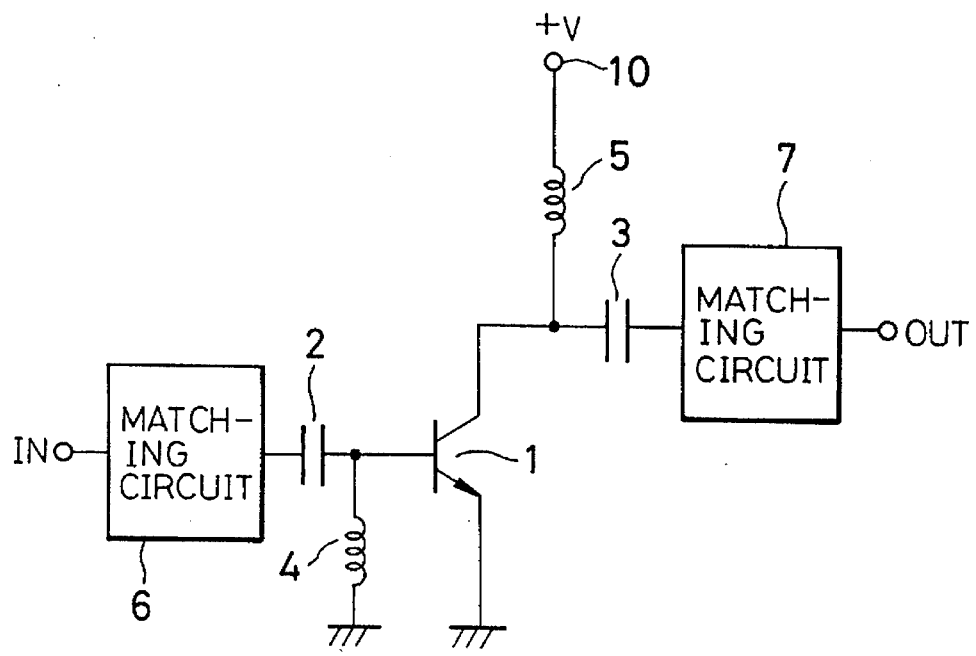
FIG. 1 is an illustration showing one embodiment of a transistor amplifier circuit according to the present invention.

FIG. 1 shows the preferred embodiment of a transistor amplifier circuit according to the present invention. In the drawing, a bipolar transistor 1 as an amplifier active element is a NPN type hetero-junction bipolar element, which bipolar transistor has an emitter and a base formed of AlGaAs. The shown bipolar transistor 1 is used in common-emitter structure. In the shown embodiment, both of the base and emitter of the transistor 1 are provided fixed bias of 0 volt. Therefore, coupling capacitors 2 and 3 and a choke coil 4 are respectively connected as shown. It should be noted that a direct current voltage 10 is applied to the collector of the transistor 1 via the choke coil 5.

Since the base and the emitter of the transistor 1 are applied 0 volt fixed bias, no current will flow through the collector unless a microwave signal is present. On the other hand, between the base and the emitter of the transistor, a diode in reverse connection is not added. Therefore, when the microwave signal is applied, substantially large voltage in reverse direction will be applied between the base and emitter.

This requires to employ a microwave transistor having high reverse withstanding voltage between the base and emitter as the transistor 1. In the present invention, a hetero-junction bipolar transistor having the emitter and the base of AlGaAs, which forms the microwave transistor with high reverse withstanding voltage, is employed.

In such hetero-junction bipolar transistor, hfe is attained by a difference of a band gap between the emitter and the base, as set forth in Herbert Kroemer, "Proceeding of the IEEE", 1982, Vol. 70, No. 1, page 13. Concerning doping amounts in the base and emitter (in the conventional bipolar transistor, higher doping concentration at the emitter than the base has been required in order to certainly maintain hfe at satisfactory value), satisfactory hfe can be certainly maintained at lower doping amount at the emitter than that of the base. Since the doping amount in the emitter is lower than that in the base, the reverse withstanding voltage between the emitter and the base becomes inversely proportional to the doping amount at the emitter.

In case of the hetero-junction bipolar transistor, it becomes unnecessary to provide high doping amount for the emitter in order to certainly maintain hfe at satisfactory value. Accordingly, with low doping amount, high reverse withstanding voltage can be realized. Also, since the band gap of AlGaAs as the material for the emitter is in the order of 1.8 eV which is higher than 1.1 eV of silicon. This contributes achieving further higher reverse withstanding voltage. It should be noted that the reference numerals 6 and 7 denote input and output matching circuits.

Figure 2:
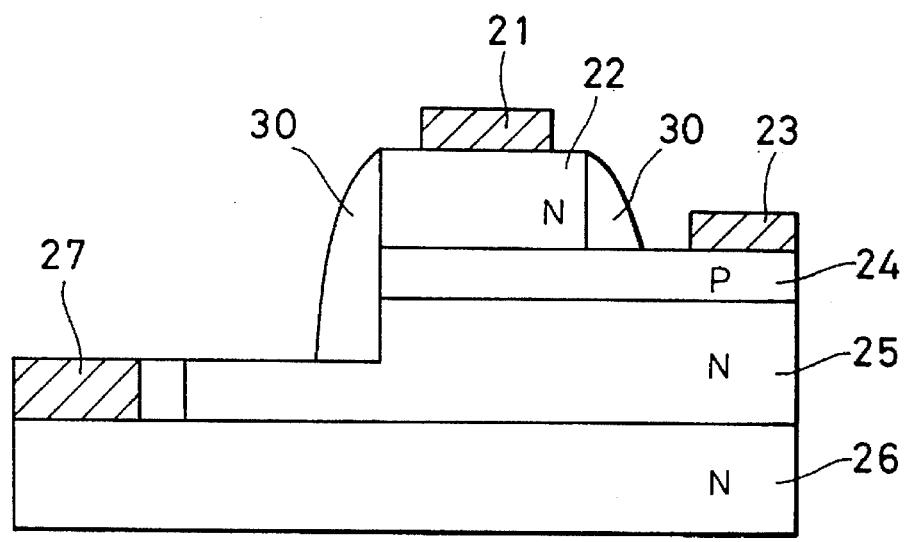
FIG. 2 is a section of a bipolar transistor employed in the transistor amplifier circuit of FIG. 1.

FIG. 2 shows a section of the structure of the hetero-junction bipolar 1 transistor. It should be noted that, as the transistor to be employed in the present invention, those disclosed in Japanese Unexamined Patent Publications Nos. 62-141770, 62-141771 and 62-141772 may be used. The disclosure of the above-identified Japanese Unexamined Patent Publications are herein incorporated by reference for the sake of disclosure.

In FIG. 2, the reference numeral 21 denotes an emitter electrode, 22 denotes a N-type emitter layer employing AlGaAs, 24 denotes a P-type base layer employing $Al_xGa_{1-x}As$ (x=0 to 0.3), 25 denotes a collector layer, 26 denotes a collector buried layer and 27 denotes a collector electrode. The reference numeral 30 denotes a high resistance or P$^-$ semiconductor layer.

When such hetero-junction bipolar transistor is employed, a recombination current via an interface between the base and emitter can be reduced to improve the reverse withstanding voltage between the emitter and the base (9 volts as actually measured value) to exhibit remarkable effect.

Detailed discussion will be given for the structure of the hetero-junction bipolar transistor, which has been disclosed in the above-identified Japanese Unexamined Patent Publications. At first, around the periphery of the base 24, P$^-$ semiconductor layer 30 which has lower electron affinity and higher resistance than the semiconductor of the base is formed. (Japanese Unexamined Patent Publication No. 62-141772).

Here, a speed V of recombination of electron and hole can be expressed as follow with assuming that capture sectional area of hole and electron is σ, a carrier velocity is Vth, a trap density is Nt, a hole concentration is p, an electron concentration is n and intrisic carrier concentration is ni:

$$V = \sigma V_{th} N_t (p \cdot n - n_i^2)/(n+p) \tag{1}$$

In FIG. 2, if the high resistance or P⁻ semiconductor layer 30 is not present, a majority of levels present on the surface of the P-type semiconductor 24 of the base becomes core for recombination so that the electron of a minority carrier implanted into the P-type semiconductor 24 is partially consumed by recombination. When the emitter size is made smaller to make the elements fine, the influence set forth above becomes significant to lower a transmission efficiency, and thus to lower current-amplification factor.

Therefore, as shown in FIG. 2, by covering the circumference of the P-type base layer 24 with the high resistance or P⁻ semiconductor layer 20 which has smaller electron affinity in comparison with the P-type base layer, dispersion of the electron to the surface of the semiconductor layer 30 can be significantly reduced by a barrier for the electron generated in the hetero-junction interface between the P-type base layer 24 and P⁻ semiconductor layer. Accordingly, the current recombined via the surface level is significantly reduced so that the current-amplification factor will not be lowered even when the emitter size is reduced.

For example, as a semiconductor 26, N-type GaAs substrate is employed. As a semiconductor 25, a N-type GaAs having $5 \times 10^{16}$ cm⁻³ of donor impurity concentration and 4000 Å of a layer thickness is employed. As the semiconductor 24, a P-type $Al_xGa_{1-x}As$ layer having $1 \times 10^{19}$ cm⁻³ of an accepter impurity concentration, 500 Å of the layer thickness and the composition ratio x varying from 0.3 to 0 toward the interface with the semiconductor layer 25 may be employed.

On the other hand, as the semiconductor 22, N-type $Al_{0.3}Ga_{0.7}As$ layer having $5 \times 10^{17}$ cm⁻³ of donor impurity concentration and 2000 Å of layer thickness, N-type $Al_xGa_{1-x}As$ layer varying the composition ratio x from 0.3 to 0 toward an ohmic electrode 21 and having 500 Å of the layer thickness, and N-type GaAs layer having $5 \times 10^{18}$ cm⁻³ of the donor impurity concentration and 300 Å of layer thickness may be employed.

As the layer 30, the layer on which P⁻ $Al_{0.5}Ga_{0.5}As$ having $1 \times 10^{14}$ cm⁻³ of impurity concentration and 2000 Å of thickness is selectively re-grown by a MOCVD method, is employed.

Secondly, around the base 24, high resistance or P⁻ semiconductor layer having greater sum of the electron affinity and band gap than the base semiconductor is formed. (Japanese Unexamined Patent Publication No. 62-141771).

In this case, as the layer 30, P⁻-type ZnSe having $1 \times 10^{14}$ cm⁻³ and 2000 Å of thickness is employed. Even in this embodiment, since the electron is accelerated by the internal field within the P-type semiconductor layer 24 to pass through the semiconductor at high speed, possibility of recombination with the hole can be reduced. Furthermore, since the surface is covered by the P⁻-type ZnSe layer 30 which has greater sum of the electron affinity and the band gap, a barrier against approximately 1.24 eV of hole at the hetero-function interface so that the hole may not disperse through the surface.

Therefore, the recombination current via the surface level can be significantly reduced so as not to lower the current-amplification factor even when the element is made fine to permit down-sizing and improvement of performance of the element.

Thirdly, in the circumferential portion of the base 24, the high resistance or P⁻-type semiconductor layer 30 which has smaller electron affinity than the semiconductor of the base but has greater sum of the electron affinity and the band gap than the semiconductor of the base. (Japanese Unexamined Patent Publication No. 62-141770).

In this embodiment, as the semiconductor 26, N-type InP substrate is employed, as the semiconductor 25, a P-type $In_{0.33}Ga_{0.67}As$ having $5 \times 10^{16}$ cm⁻³ of donor impurity concentration and 2000 Å of a layer thickness is employed, as the semiconductor 24, a P-type $In_{0.33}Ga_{0.67}As$ layer having $2 \times 10^{18}$ cm⁻³ of an accepter impurity concentration and 200 Å of the layer thickness, and as the semiconductor 22, N-type InP layer having $5 \times 10^{17}$ cm⁻³ of donor impurity concentration and 2000 Å of layer thickness and N-type InP layer having $5 \times 10^{16}$ cm⁻³ and 3000 Å of the layer thickness are employed.

As the layer 30, the layer, in which P⁻-type InP having $1 \times 10^{14}$ cm⁻³ of impurity concentration and 2000 Å of thickness is selectively grown by a VPE method, is employed. By this, since the surface of the base layer 24 is covered by the P⁻-type InP layer 30, a barrier of 0.4 eV against the hole and 0.2 eV against the electron is generated at InP/InGaAs hetero-junction interface. Thus, the hole and the electron may not disperse on the surface to permit significant reduction of the recombination current via the surface level.

By the construction as set forth above, recombination current via the surface and interface in the hetero-junction bipolar transistor can be reduced to permit the reverse withstanding voltage between the emitter and the base to be further higher.

It should be noted that the bias voltage between the base and emitter of the transistor 1 may be a negative value deeper than 0 for C class bias.

Figure 3:
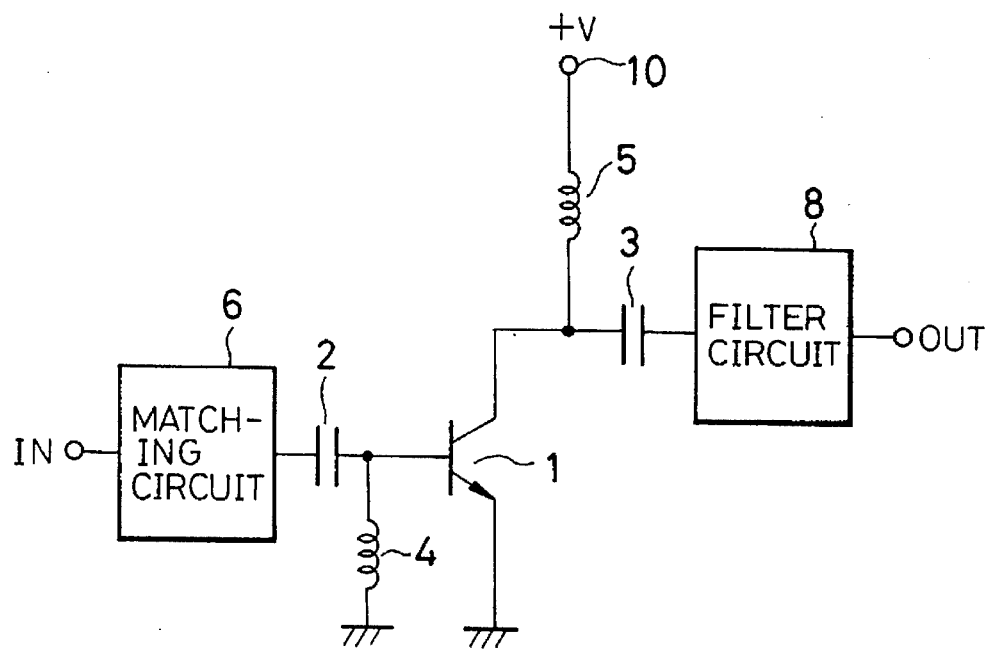
FIG. 3 is an illustration showing one embodiment of a transistor frequency multiplier circuit according to the invention.

FIG. 3 is a circuit diagram of another embodiment of the present invention, in which is illustrated the embodiment of a frequency multiplier circuit. In FIG. 3, the like components to FIG. 1 will be represented by like reference numerals. The bipolar transistor 1 is the hetero-junction bipolar transistor similarly to the embodiment of FIG. 1 and having the structure illustrated in FIG. 2. In the shown circuit, a filter circuit is employed as the output matching circuit 8.

Even in this embodiment, the base and emitter of the transistor 1 has fixed bias at 0 volt. Therefore, when microwave signal is not present, no collector current will flow to improve efficiency.

On the other hand, the bias voltage between the base and the emitter can be negative bias other than 0 bias. As set forth, since deeper bias can be used, the transistor can operate with B class bias or C class bias. Therefore, by employing the filter circuit for extracting a frequency of an integer multiple of the input signal frequency or tuning circuit, multiplication of the frequency can be achieved.

Figure 4:
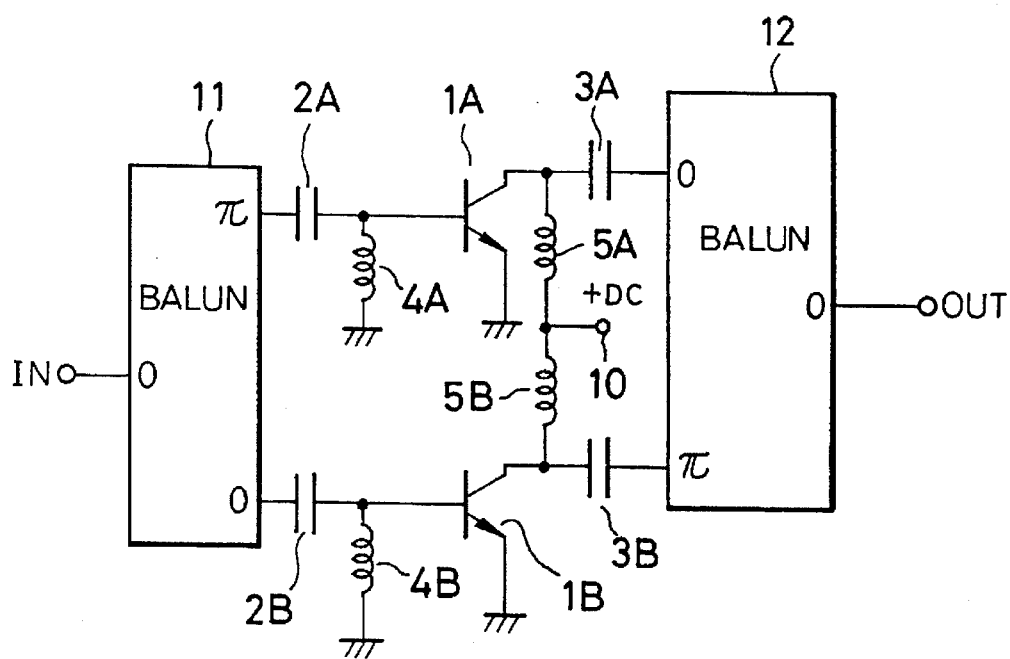
FIG. 4 is an illustration showing one embodiment of a transistor push-pull circuit according to the invention.

FIG. 4 is a circuit diagram showing a further embodiment of the present invention, in which is illustrated the embodiment as an application for a push-pull amplifier circuit. In FIG. 4, the like components to FIG. 1 will be represented by the same reference numerals. Bipolar transistors 1A and 1B are hetero-junction bipolar transistors similarly to the embodiment of FIG. 1 and having the structures illustrated in FIG. 2. These transistors 1A and 1B are used in the common emitter fashion and operate as the push-pull circuit with input and output baluns 11 and 12. By the balun 11, positive phase and negative phase signals of the input signal are obtained. On the other hand, by the balun 12, the outputs of the transistors 1A and 1B are synthesized for outputting.

In the shown embodiment, both of the bases and emitters of the transistors 1A and 1B have the fixed bias at 0 volt.

Therefore, coupling capacitors 2A, 2B, 3A, 3B and choke coils 4A and 4B are connected as shown. It should be noted that, to respective collectors, direct current voltage (DC) is applied through choke coils 5A and 5B.

It should be noted that when each bias point of each of the transistors 1A and 1B is selected to be deeper than B class bias, linearity in cut-off operation can be degraded. However, since the shown embodiment is directed to the push-pull construction so that when one is in the cut-off state, the other is in active state to provide compensation for distortion. Thus, high efficiency amplifier with high linearity can be achieved.

As set forth above, according to the present invention, employing the hereto-junction bipolar transistor using AlGaAs which has greater band gap than silicon for the emitter and the base and having smaller doping amount at the emitter than that of the base, the reverse withstanding characteristics can be significantly improved. Also, since common emitter amplifier circuit which can operate at deeper bias, it becomes possible to achieve high efficiency, high output, high reliability and wide band characteristics.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A bipolar transistor circuit for use in a microwave high output amplifier, comprising:

an NPN-type hetero-junction bipolar transistor used as an active element for amplification and including an emitter formed as an emitter layer of AlGaAs, a base formed of AlGaAs, and a collector, said bipolar transistor further comprising a high resistance or $P^-$ semiconductor layer having a smaller electron affinity than a semiconductor of said base, said semiconductor layer being provided around a periphery of said emitter layer and having a portion extending towards said collector to overlap a laterally exposed part of said base layer and a laterally exposed part of said collector; and amplifying means comprising an inductance connected between said base and a ground, said emitter being connected to the ground, wherein a microwave signal is inputted to said base and an amplified signal is outputted from the collector of said bipolar transistor.

* * * * *